(12) United States Patent
Yamamoto et al.

(10) Patent No.: US 7,985,968 B2
(45) Date of Patent: Jul. 26, 2011

(54) DISPLAY DEVICE

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 130 days.

(21) Appl. No.: 12/253,447

(22) Filed: Oct. 17, 2008

(65) Prior Publication Data

US 2009/0101904 A1    Apr. 23, 2009

(30) Foreign Application Priority Data

Oct. 19, 2007  (JP) ................. 2007-271891

(51) Int. Cl.
*H01L 29/04* (2006.01)
(52) U.S. Cl. ................. 257/59; 257/E29.003
(58) Field of Classification Search ........ 257/59
See application file for complete search history.

(56) References Cited

U.S. PATENT DOCUMENTS

2005/0112805 A1 * 5/2005 Goto et al. ............ 438/149
2008/0252839 A1 * 10/2008 Nakadaira ............ 349/153

FOREIGN PATENT DOCUMENTS

| JP | 2005-164818 |   | 6/2005 |
| JP | 2005164818  | * | 6/2005 |
| JP | 2006-054111 |   | 2/2006 |
| JP | 2006-066206 |   | 3/2006 |
| JP | 2006-080505 |   | 3/2006 |
| JP | 2006080505  | * | 3/2006 |
| JP | 2006-156403 |   | 6/2006 |
| JP | 2008262796 A | * | 10/2008 |

OTHER PUBLICATIONS

Japanese Office Action issued on Aug. 25, 2009 in connection with JP Application No. 2007-271891.

* cited by examiner

*Primary Examiner* — Jarrett J Stark
*Assistant Examiner* — Lawrence Tynes, Jr.
(74) *Attorney, Agent, or Firm* — SNR Denton US LLP

(57) ABSTRACT

Disclosed herein is a display device including: a support substrate; a drive circuit provided on the support substrate; an interlayer insulating film which covers the drive circuit; organic field light-emitting elements arranged in a display region on the interlayer insulating film; and a lead-out wiring extended from the organic field light-emitting elements to a peripheral region around the display region, wherein the interlayer insulating film includes a laminated film made up of an inorganic insulating film and organic insulating film stacked in this order, the organic insulating film has an isolation trench which surrounds the display region, the isolation trench being devoid of the organic insulating film and having the inorganic insulating film at its bottom, and the drive circuit and lead-out wiring are insulated from each other by the inorganic insulating film where the lead-out wiring crosses the isolation trench.

5 Claims, 6 Drawing Sheets

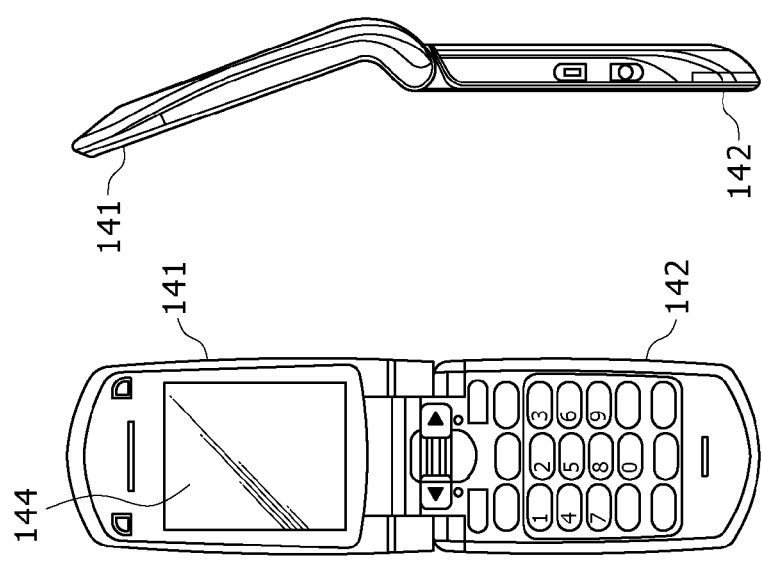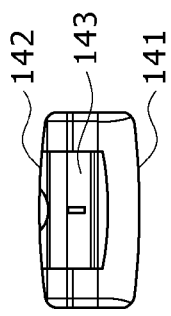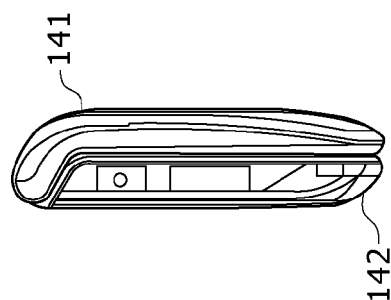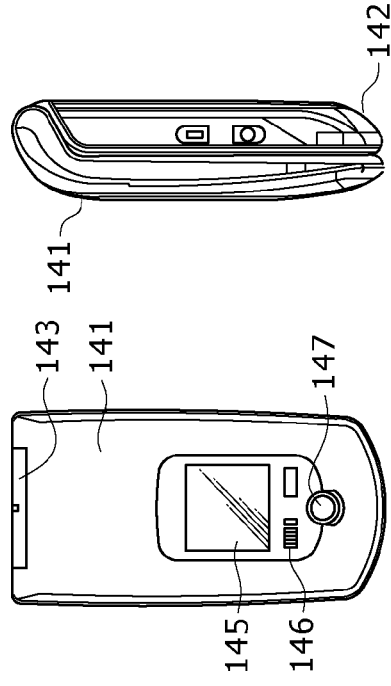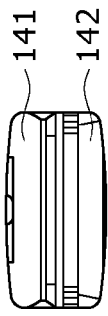

DISPLAY DEVICE

CROSS REFERENCES TO RELATED APPLICATIONS

The present invention contains subject matter related to Japanese Patent Application JP 2007-271891 filed in the Japan Patent Office on Oct. 19, 2007, the entire contents of which being incorporated herein by reference.

BACKGROUND OF THE INVENTION

1. Field of the Invention

The present invention relates to a display device, and more particularly to a display device suitable for application to a display device having organic field light-emitting elements.

2. Description of the Related Art

An organic field light-emitting element using the electroluminescence (hereinafter written as EL) of an organic material, which includes an organic hole transporting layer and organic light-emitting layer stacked between the anode and cathode, is drawing attention as a low-voltage-DC-driven light-emitting element capable of emitting highly bright light. In a display device having organic field light-emitting elements arranged therein, however, the same elements undergo deterioration of their organic layer due to moisture absorption, resulting in low stability over time and short service life of the display device such as reduced light emission brightness and unstable light emission of the same elements.

Particularly in the case of an active matrix display device, an interlayer insulating film is provided in such a manner as to cover the drive circuit which includes thin film transistors. Organic field light-emitting elements are arranged on the interlayer insulating film. In this case, the organic field light-emitting elements are formed on the surface whose irregularities, caused by the formation of the drive circuit, are planarized. Therefore, the interlayer insulating film (organic insulating film) is formed as a planarizing film using, for example, an organic photosensitive insulating film. However, the organic insulating film is highly pervious to water. As a result, the organic field light-emitting elements have been prone to deterioration due to moisture absorption as described above.

Therefore, a configuration has been proposed in which an isolation trench is provided at the position of the organic insulating film surrounding the display region (refer, for example, to Japanese Patent Laid-Open No. 2006-054111). The organic insulating film serves as an underlying layer of the organic field light-emitting elements. The isolation trench is devoid of the organic insulating film. As a result, this configuration prevents moisture entry via the organic insulating film.

SUMMARY OF THE INVENTION

In an active matrix display device, however, a lead-out wiring from the organic field light-emitting elements is extended from the display region to the peripheral region on the organic insulating film. For this reason, the lead-out wiring crosses the isolation trench provided in the organic insulating film. As a result, a short circuit has readily occurred between the lead-out wiring and drive circuit beneath the organic insulating film at the bottom or on the sidewall of the isolation trench.

In light of the foregoing, it is desirable to provide a display device which can positively prevent a short circuit between the lead-out wiring, extended from the organic field light-emitting elements, and the drive circuit while at the same time preventing the deterioration of the organic field light-emitting elements due to moisture diffusion.

The display device according to an embodiment of the present invention includes a support substrate, a drive circuit provided on the support substrate, and an interlayer insulating film which covers the drive circuit. The display device further includes organic field light-emitting elements arranged in a display region on the interlayer insulating film. The display device still further includes a lead-out wiring extended from the organic field light-emitting elements to a peripheral region around the display region. In the display device configured as described above, the interlayer insulating film includes a laminated film made up of an inorganic insulating film and organic insulating film stacked in this order. In the display device, the organic insulating film has an isolation trench which surrounds the display region. The isolation trench is devoid of the organic insulating film and has the inorganic insulating film at its bottom. As a result, the drive circuit and lead-out wiring are insulated from each other by the inorganic insulating film where the lead-out wiring crosses the isolation trench.

In the display device configured as described above, the inorganic insulating film disposed below the organic insulating film positively covers the drive circuit. Therefore, the drive circuit is not exposed on the sidewall or at bottom of the isolation trench provided in the organic insulating film. This positively prevents a short circuit between the lead-out wiring crossing the isolation trench over the organic insulating film and the drive circuit disposed below the inorganic insulating film.

As described above, the display device according to an embodiment of the present invention has an isolation trench in the organic insulating film, thus positively preventing a short circuit between the lead-out wiring extended from the organic field light-emitting elements and the drive circuit while at the same time preventing the deterioration of the organic field light-emitting elements due to moisture diffusion.

BRIEF DESCRIPTION OF THE DRAWINGS

FIG. 5A is a perspective view as seen from the front, and FIG. 5B is a perspective view as seen from the rear;

FIGS. 8A to 8G are views illustrating a mobile terminal device such as mobile phone to which the present invention is applied, and FIG. 8A is a front view of the mobile phone in an open position, FIG. 8B is a side view thereof, FIG. 8C is a front view thereof in a closed position, FIG. 8D is a left side view thereof, FIG. 8E is a right side view thereof, FIG. 8F is a top view thereof, and FIG. 8G is a bottom view thereof.

DETAILED DESCRIPTION OF THE PREFERRED EMBODIMENTS

The preferred embodiments of the present invention will be described in detail below based on the accompanying drawings.

Figure 1A:
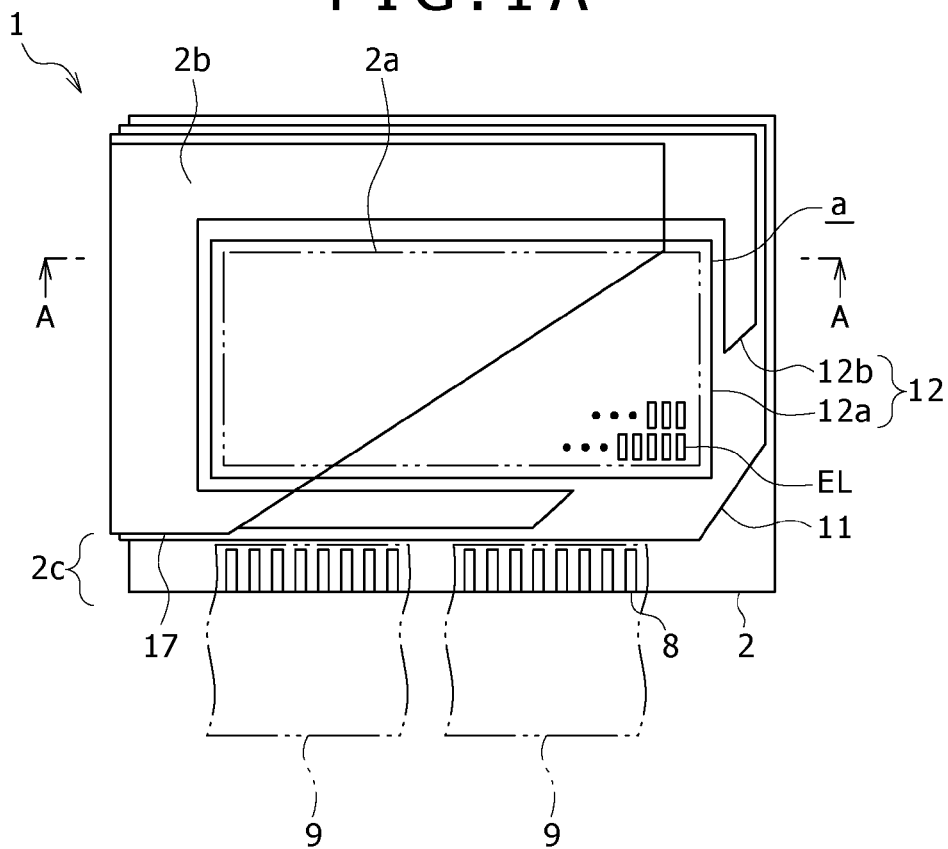
FIGS. 1A and 1B are schematic configuration diagrams illustrating the overall configuration of a display device according to an embodiment.
Figure 1B:
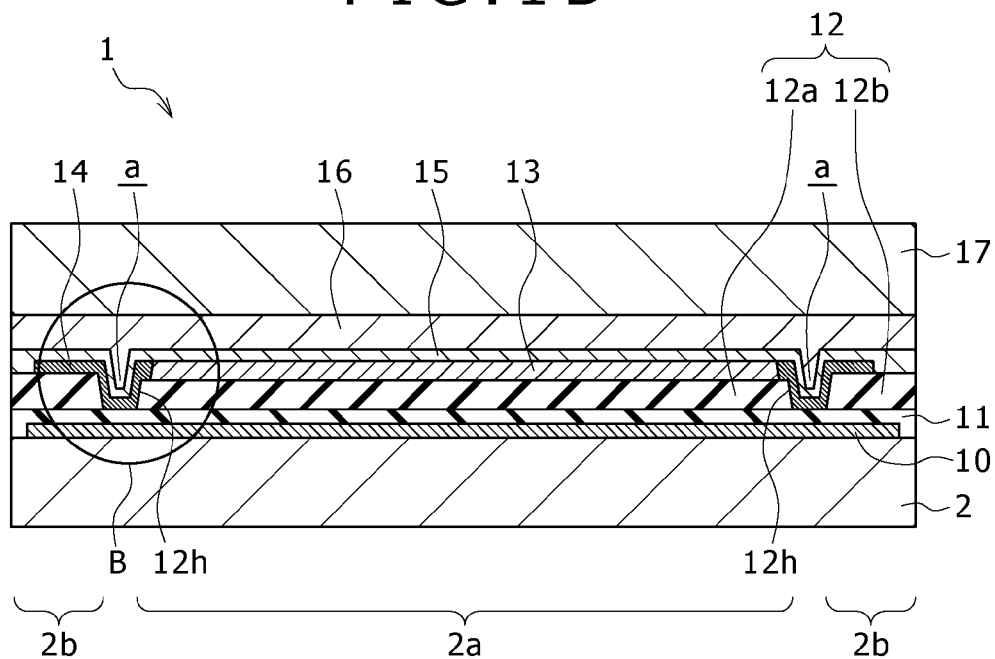

FIG. 1A is a plan view illustrating the display device according to an embodiment. FIG. 1B is a schematic sectional view taken along line A-A' of FIG. 1A. In FIG. 1A, some of the components are shown to be cut away for the purpose of description.

First, as illustrated in the plan view of FIG. 1A, a display device 1 is a so-called organic EL display device using organic field light-emitting elements as light-emitting elements. The display device 1 includes a substrate (element substrate in this case) 2 made of a glass or other transparent material. The display device 1 further includes a display region 2a formed over the substrate 2. Organic field light-emitting elements EL are arranged in the display region 2a. The display device 1 still further includes a peripheral region 2b provided around the display region 2a. The display device 1 still further includes a mounting region 2c where external circuitry such as IC chips and circuit substrates will be mounted later.

Of these regions, the display region 2a has, in addition to the organic field light-emitting elements EL, pixel circuits adapted to drive the same elements EL arranged over the support substrate 2 as pixels. Each of the pixel circuits has a thin film transistor as a switching element.

The peripheral region 2b around the display region 2a has peripheral circuits (not shown) adapted to transmit scan and data signals to the organic field light-emitting elements EL. These peripheral circuits also include thin film transistors.

Figure 2:
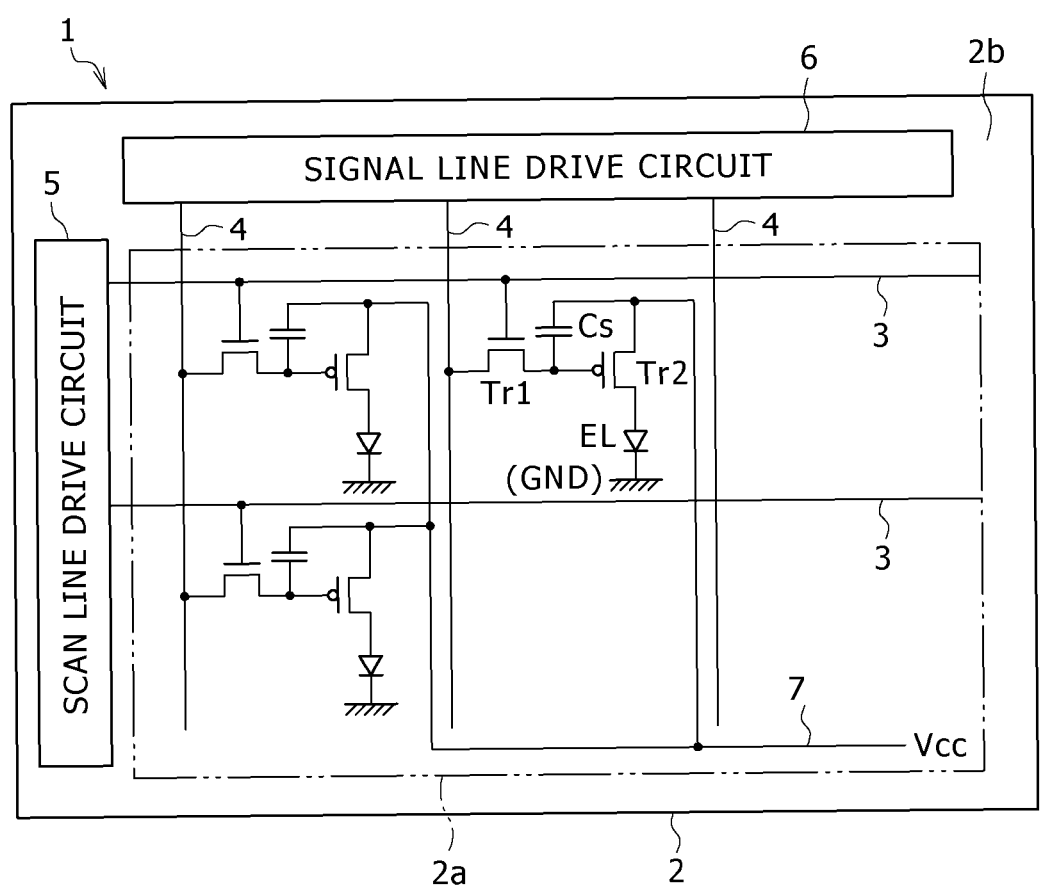
FIG. 2 is a view illustrating an example of circuit configuration of the display device according to the embodiment.

FIG. 2 is a circuit configuration diagram schematically illustrating an example of the drive circuit which includes the aforementioned pixel circuits and peripheral circuits. As illustrated in FIG. 2, the display region 2a and peripheral region 2b are provided over the support substrate 2 of the display device 1. The display region 2a includes a plurality of scan lines 3 and a plurality of signal lines 4 which are disposed respectively horizontally and vertically. A pixel is provided at one of the intersections between the scan lines 3 and signal lines 4. These pixels make up a pixel array section. The peripheral region 2b includes a scan line drive circuit 5 adapted to drive the scan lines 3 and a signal line drive circuit 6 adapted to supply a video signal (i.e., input signal) appropriate to brightness information to the signal lines 4.

Each of the pixel circuits provided at one of the intersections between the scan lines 3 and signal lines 4 includes, for example, a switching thin film transistor Tr1, a driving thin film transistor Tr2, a holding capacitance Cs and the organic field light-emitting element EL. As the scan line is driven by the scan line drive circuit 5, the video signal written from the signal line 4 via the switching thin film transistor Tr1 is held in the holding capacitance Cs. As a result, the current appropriate to the signal level held by the capacitance is supplied from the driving thin film transistor Tr2 to the organic field light-emitting element EL, causing the same element EL to emit light at the brightness appropriate to the current level. It should be noted that the driving thin film transistor Tr2 and holding capacitance Cs are connected to a common power supply line (Vcc) 7.

It should be noted that the above configuration of the drive circuit is merely an example. A capacitor may be provided in the pixel circuits as necessary. Further, the pixel circuits may include a plurality of transistors. On the other hand, necessary peripheral circuitry is added to the peripheral region 2b to accommodate the change in the pixel circuits.

Referring back to FIG. 1A, the mounting region 2c includes, for example, terminals 8 arranged to receive external signals to be fed to the drive circuits (peripheral circuits) 5 and 6 provided in the peripheral region 2b. It should be noted that a flexible printed substrate 9 is connected, for example, to the terminals 8. The flexible printed substrate 9 allows exchange of signals or other information between external equipment and the display region 2a (pixel array section). External circuits are mounted via the same substrate 9.

The display device having the display region 2a, peripheral region 2b and mounting region 2c as described above includes the layers as illustrated in FIGS. 1A and 1B. That is, a drive circuit layer 10 (only the sectional view thereof is shown) is provided on the support substrate 2. On the drive circuit layer 10 are formed the pixel circuits of the display region 2a, peripheral circuits of the peripheral region 2b and connection wirings and so on adapted to connect these circuits. Then, an inorganic insulating film 11 is provided as a passivation film over the display region 2a and peripheral region of the support substrate 2 so as to cover the drive circuit layer 10. Further, an organic insulating film 12 is provided whose surface is planarized.

In the display region 2a which includes the inorganic and organic insulating films 11 and 12 as described above, an EL layer 13 (only the sectional view thereof is shown) is provided. The EL layer 13 has the organic field light-emitting elements EL arranged thereon. Further, on this interlayer insulating film (organic insulating film 12) is formed a lead-out wiring 14 led out from the organic field light-emitting elements EL to the peripheral region 2b.

The organic insulating film 12 having the organic field light-emitting elements EL (EL layer 13) and lead-out wiring 14 is covered with a sealing inorganic insulating film 15 (only the sectional view thereof is shown). It should be noted that the terminals 8 are disposed in an exposed manner on the mounting region 2c.

Then, an opposed substrate 17 is attached via an adhesive layer 16 (shown only in the sectional view) over the support substrate 2 where the display region 2a and peripheral region 2b are covered with the inorganic insulating film 15. The organic field light-emitting elements EL are sealed between the support and opposed substrates 2 and 17. It should be noted that the adhesive layer 16 is made of a material highly impervious to water and functions as a sealing resin.

It should be noted that, in the plan view of FIG. 1A, the inorganic and organic insulating films 11 and 12 serving as the interlayer insulating films and the opposed substrate 17 are shown to be partially cut away for the description of the layered structure.

An isolation trench a is provided in the display device 1 according to the present embodiment having the layered structure as described above. The isolation trench a is provided in the organic insulating film 12 which covers the drive circuit layer 10. The isolation trench a has the inorganic insulating film 11 at its bottom. The first characteristic feature of the display device is that the isolation trench a separates the organic insulating film 12 into inner and outer peripheral portions 12a and 12b.

The isolation trench a is the portion forming the trench shape completely devoid of the organic insulating film 12. The isolation trench a should preferably be provided between the display region 2a and peripheral region 2b to surround the entire circumference of the display region 2a.

As a result, the lead-out wiring 14, led out from the organic field light-emitting elements EL (EL layer 13) in the display region 2a to the peripheral region 2a, cross the isolation trench a over the organic insulating film 12. As described next, the second characteristic feature of the display device 1 according to the present embodiment is that the lead-out wiring 14 is insulated from the drive circuit layer 10 in the isolation trench a by the inorganic insulating film 11.

Figure 3:
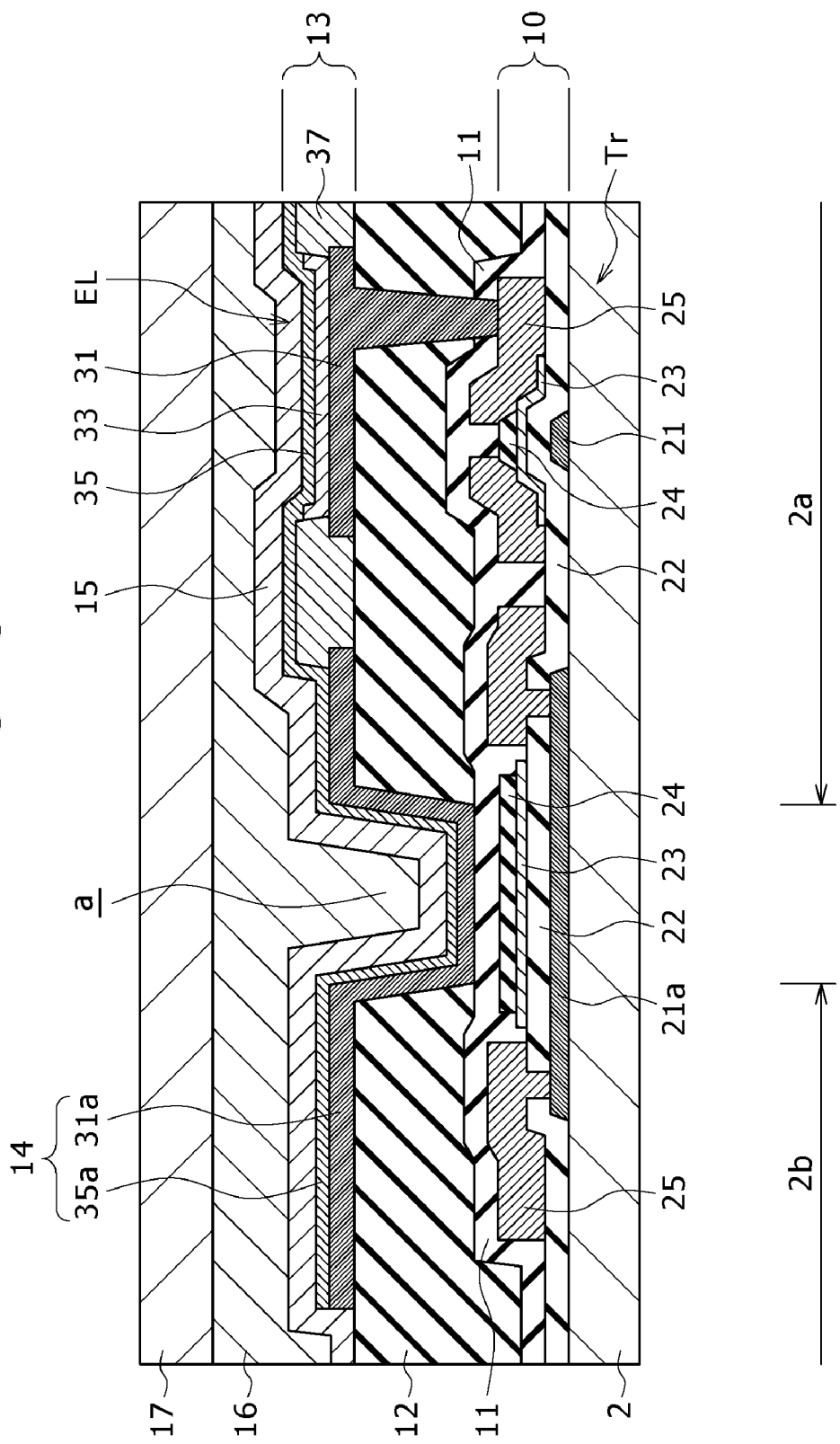
FIG. 3 is a sectional view illustrating the characteristic portions of the display device according to the embodiment.

FIG. 3 illustrates an enlarged sectional view of a portion B in the schematic sectional view of FIG. 1B. A detailed description will be given below of the layered structure of the isolation trench a and region therearound with reference to FIGS. 1A and 1B and based on the enlarged sectional view of FIG. 3. It should be noted that the display region 2a shows the section of one pixel.

As illustrated in FIG. 3, a thin film transistor Tr is provided in the display region 2a on the support substrate 2. The thin film transistor Tr is, for example, a bottom gate transistor using a semiconductor layer which includes amorphous silicon. A gate electrode 21, gate insulating film 22 and semiconductor layer 23 are stacked on the thin film transistor Tr. The gate electrode 21 includes, for example, molybdenum (Mo). On the semiconductor layer 23 is patterned a stopper insulating film 24 for protection purpose made of silicon nitride. On the stopper insulating film 24 are patterned source and drain electrodes 25 in contact with the semiconductor layer 23. The source and drain electrodes 25 are patterned by separating the conductive film.

Further, thin film transistors (not shown) and electrodes 25 are provided in the peripheral region 2b on the support substrate 2. The thin film transistors and electrodes 25 make up the peripheral circuits. A semiconductor layer including amorphous silicon should preferably be used for the thin film transistors in the peripheral region 2b. On the other hand, the electrodes 25 may be formed with the same layer as for the electrodes 25 in the display region 2a. It should be noted that the electrodes 25 have a layered structure made up, for example, of titanium (Ti), aluminum (Al) and titanium (Ti).

A connection wiring (wiring) 21a is provided between the display region 2a and peripheral region 2b over the support substrate 2. The connection wiring 21a includes the same layer as for the gate electrode 21. The connection wiring 21a connects the electrodes 25 making up the pixel circuits in the display region 2a and the electrodes 25 making up the peripheral circuits in the peripheral region 2b.

The insulating film and semiconductor layer, included in the drive circuit layer 10 described above, are stacked on the connection wiring 21a. In the illustrated example, therefore, the gate insulating film 22, semiconductor layer 23 and stopper insulating film 24 are provided on the connection wiring 21a. The gate insulating film 22 makes up the pixel and peripheral circuits. The stopper insulating film 24 is disposed between the semiconductor layer 23 of the transistor Tr and electrodes 25.

The aforementioned layers on the support substrate 2 serve as the drive circuit layer 10 described using FIG. 1B.

Further, the interlayer insulating film is provided to cover the drive circuit layer 10. The interlayer insulating film has a layered structure made up of the inorganic and organic insulating films 11 and 12.

Here, the inorganic insulating film 11 includes, for example, a silicon nitride film. The same film 11 is provided to prevent the deterioration over time of the semiconductor layer 23 which includes amorphous silicon. In contrast, the organic insulating film 12 includes a photosensitive composition and is formed by coating process. The same film 12 has the isolation trench a between the display region 2a and peripheral region 2b. The isolation trench a is formed by lithography and surrounds the display region 2a. The isolation trench a includes the inorganic insulating film 11 at its bottom.

The organic field light-emitting elements EL are arranged in the display region 2a on the organic insulating film 12. The same elements EL includes a lower electrode 31, organic layer 33 and upper electrode 35 stacked in this order from the side of the organic insulating film 12.

Of these, the lower electrode 31 is used as an anode (or cathode) and patterned as a pixel electrode. Further, the same electrode 31 is connected to the thin film transistor Tr via a connection hole 12h and the electrode 25. The connection hole 12h is provided in the organic insulating film 12. The electrode 25 is provided at the bottom of the connection hole 12h. If light emitted by the organic field light-emitting elements EL is extracted only from the side of the upper electrode 35, the lower electrode 31 includes a light-reflecting metallic material. On the other hand, each of the lower electrodes 31 is covered therearound with a window insulating film 37 and widely exposed at the center thereof. The window insulating film 37 includes, for example, a photosensitive composition. Then, an opening portion is formed by lithography which has a wide opening on the lower electrode 31.

The organic layer 33 includes at least an organic light-emitting layer. The same layer 33 is patterned so as to completely cover the lower electrode 31 which is exposed from the window insulating film 37.

The upper electrode 35 is used as a cathode (or anode). The same electrode 35 is formed as a common electrode for the organic field light-emitting elements EL. The same electrode 35 covers the entire display region 2a. If light emitted by the organic field light-emitting elements EL is extracted from the side of the upper electrode 35, the same electrode 35 is light-transmissive. Further, the upper electrode 35 is insulated from the lower electrodes 31 by the organic layer 33 and window insulating film 37.

Here, the layer, on which the organic field light-emitting elements EL configured as described above are arranged, serves as the EL layer 13 described using FIG. 1B. The EL layer 13 is provided in the display region 2a.

The lead-out wiring 14, extended from the upper electrode 35 of the organic field light-emitting elements EL, is led out from the EL layer 13 of the display region 2a described above to the peripheral region 2b. The lead-out wiring 14 has a layered structure made up of lead-out wiring portions 35a and 31a. The lead-out wiring portion 35a is extended from the upper electrode 35. The lead-out wiring portion 31a is formed by patterning the same layer as for the lower electrode 31. This configuration ensures conductivity.

The lead-out wiring 14 configured as described above is disposed along the inner wall of the isolation trench a so as to cross the same trench a from the display region 2a to the peripheral region 2b. At the bottom of the isolation trench a, the lead-out wiring 14 is insulated from the connection wiring 21a of the drive circuit layer 10 by the inorganic insulating film 11, stopper insulating film 24, semiconductor layer 23 and gate insulating film 22 provided between the two wirings. Further, on the sidewall of the isolation trench a, the lead-out wiring 14 is insulated primarily from the electrode 25 of the drive circuit layer 10 by the inorganic insulating film 11 which covers the drive circuit layer 10.

Thus, the EL layer 13 and lead-out wiring 14 are provided over the support substrate 2. As described earlier, the support substrate 2 is covered with the inorganic insulating film 15, and the sealing substrate 17 attached via the adhesive 16 to form the display device 1.

In the display device 1 configured as described above, the inorganic insulating film 11 below the organic insulating film 12 positively covers the drive circuit layer 10. As a result, the drive circuit layer 10 is not exposed on the sidewall or at bottom of the isolation trench a provided in the organic insulating film 12. Therefore, a short circuit can be positively prevented between the lead-out wiring 14 crossing the isolation trench a over the organic insulating film 12 and the drive circuit layer 10 disposed below the inorganic insulating film 11.

This makes it possible to positively prevent a short circuit between the lead-out wiring 14 extended from the organic field light-emitting elements EL and the drive circuit layer 10 while at the same time preventing the deterioration of the same elements EL due to moisture diffusion thanks to the isolation trench a provided in the organic insulating film 12.

In particular, the gate insulating film 22, semiconductor layer 23 and stopper insulating film 24, which make up the drive circuit layer 10, are disposed below the inorganic insulating film 11 between the connection wiring 21a and lead-out wiring 14. This provides further positive insulation between the connection wiring 21a and lead-out wiring 14. This also provides a smaller aspect ratio of the isolation trench a, thus preventing the disconnection of the lead-out wiring 14.

It should be noted that, in the aforementioned embodiment, the lead-out wiring 14 and drive circuit layer 10 are positively insulated from each other by the inorganic insulating film 11. Therefore, a conductive pattern, formed with the same layer as for the electrode 25, may be disposed in a ring form below the inorganic insulating film 11 along the isolation trench a so as to provide a smaller aspect ratio of the isolation trench a and prevent the disconnection of the lead-out wiring 14. Such a configuration is particularly effective for the present embodiment in which the inorganic insulating film 11 is provided to cover the drive circuit layer 10 which includes up to the electrodes 25.

That is, if the inorganic insulating film 11 is not provided at the position indicated in the present embodiment, the conductive pattern in a ring form and the lead-out wiring 14 are connected directly. As a result, the conductive pattern serves as an auxiliary wiring for the lead-out wiring 14. However, a cross short circuit is likely to occur between the conductive pattern and the drive circuit layer 10 including the connection wiring 21a, thus resulting in reduced yield.

In the above embodiment, on the other hand, a configuration has been described in which the bottom gate thin film transistor Tr is provided in the pixel circuit. The bottom gate thin film transistor Tr has the electrodes 25 serving respectively as the source and drain. The electrodes 25 are separated on the stopper insulating film 24 which in turn lies on the semiconductor layer 23. However, the thin film transistor Tr making up the drive circuit including the pixel circuit is not limited in configuration. The same effect can be achieved even if the stopper insulating film 24 is not provided or the transistor Tr is a top gate thin film transistor.

Further, in the above embodiment, a configuration has been described in which the lead-out wiring 14 has a layered structure made up of the lead-out wiring portions 35a and 31a. The lead-out wiring portion 35a is extended from the upper electrode 35. The lead-out wiring portion 31a is formed by patterning the same layer as for the lower electrode 31. However, if the upper electrode 35 is sufficiently conductive, the lead-out wiring 14 may have a single layer structure made up of the lead-out wiring portion 35a extended from the upper electrode 35. In this case, if the window insulating film 37 includes an inorganic insulating film and is provided to cover even the inner wall of the isolation trench a, further positive insulation can be achieved between the lead-out wiring 14, made up only of the lead-out wiring portion 35a extended from the upper electrode 35, and the drive circuit layer 10.

APPLICATION EXAMPLES

The display device according to the embodiment of the present invention described above is applicable as a display of electronic equipment illustrated in FIGS. 4 to 8 across all fields including a digital camera, laptop personal computer, mobile terminal device such as mobile phone and video camcorder. These pieces of equipment are designed to display an image or video of a video signal fed to or generated inside the electronic equipment. Examples of electronic equipment to which the present invention is applied will be described below.

Figure 4:
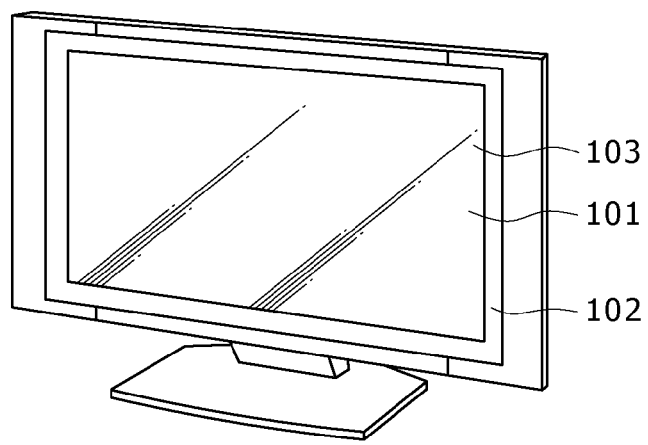
FIG. 4 is a perspective view illustrating a television set to which the present invention is applied.

FIG. 4 is a perspective view illustrating a television set to which the present invention is applied. The television set according to the present application example includes a video display screen section 101 made up, for example, of a front panel 102, filter glass 103 and other parts. The television set is manufactured by using the display device according to the embodiment of the present invention as the video display screen section 101.

Figure 5A:
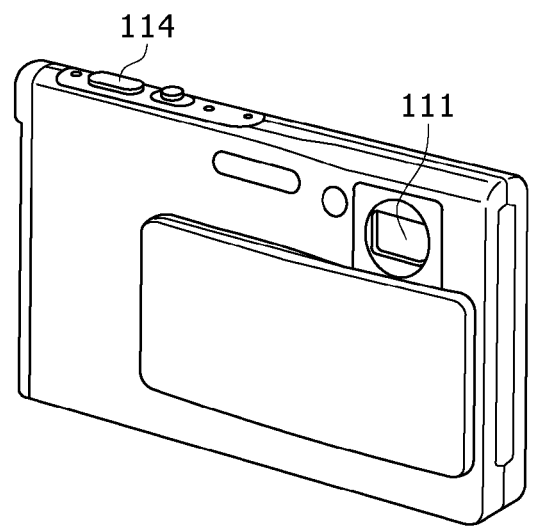
FIGS. 5A and 5B are perspective views illustrating a digital camera to which the present invention is applied.
Figure 5B:
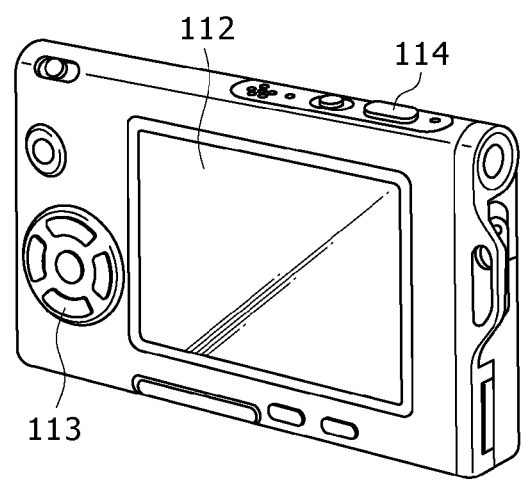

FIGS. 5A and 5B are views illustrating a digital camera to which the present invention is applied. FIG. 5A is a perspective view of the digital camera as seen from the front, and FIG. 5B is a perspective view thereof as seen from the rear. The digital camera according to the present application example includes a flash-emitting section 111, display section 112, menu switch 113, shutter button 114 and other parts. The digital camera is manufactured by using the display device according to the embodiment of the present invention as the display section 112.

Figure 6:
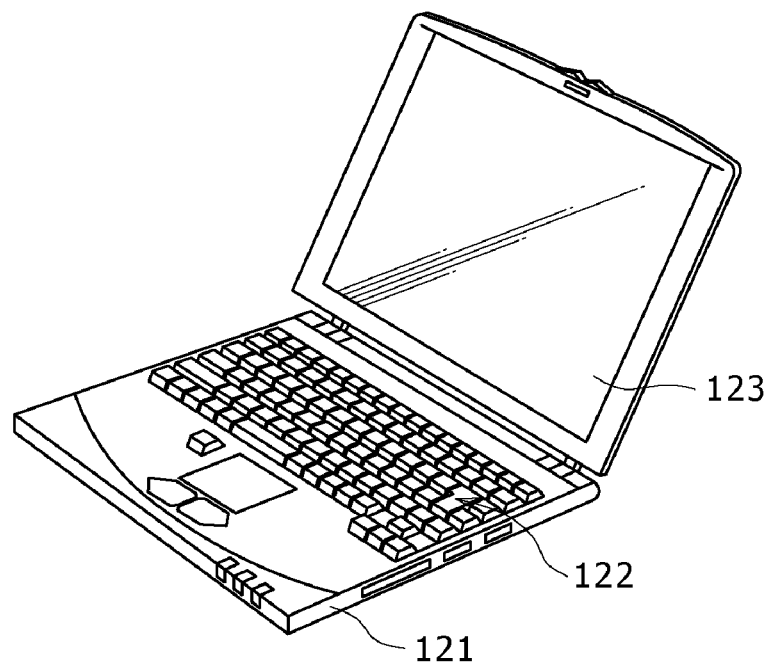
FIG. 6 is a perspective view illustrating a laptop personal computer to which the present invention is applied.

FIG. 6 is a perspective view illustrating a laptop personal computer to which the present invention is applied. The laptop personal computer according to the present application example includes, in a main body 121, a keyboard 122 adapted to be manipulated for entry of text or other information, a display section 123 adapted to display an image, and other parts. The laptop personal computer is manufactured by using the display device according to the embodiment of the present invention as the display section 123.

Figure 7:
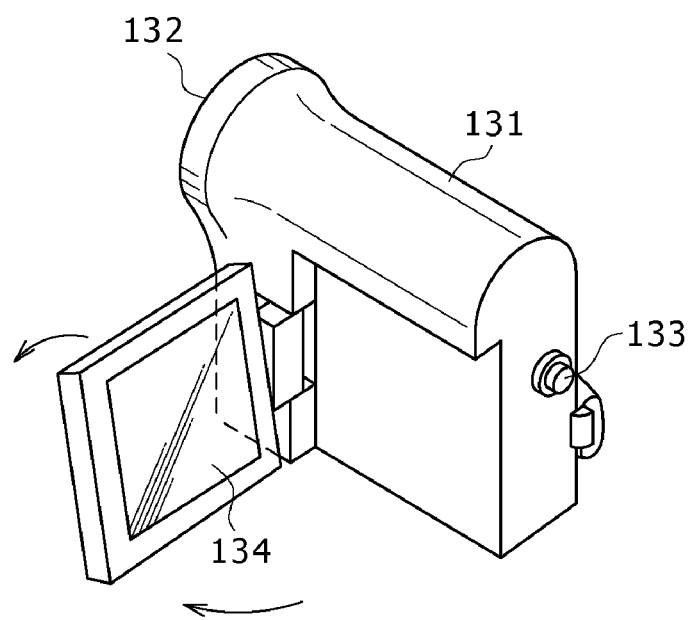
FIG. 7 is a perspective view illustrating a video camcorder to which the present invention is applied.

FIG. 7 is a perspective view illustrating a video camcorder to which the present invention is applied. The video camcorder according to the present application example includes a main body section 131, lens 132 provided on the front-facing side surface to image the subject, imaging start/stop switch 133, display section 134 and other parts. The video camcorder is manufactured by using the display device according to the embodiment of the present invention as the display section 134.

FIGS. 8A to 8G are perspective views illustrating a mobile terminal device such as mobile phone to which the present invention is applied. FIG. 8A is a front view of the mobile phone in an open position. FIG. 8B is a side view thereof. FIG. 8C is a front view of the mobile phone in a closed position. FIG. 8D is a left side view. FIG. 8E is a right side view. FIG. 8F is a top view. FIG. 8G is a bottom view. The mobile phone according to the present application example includes an upper enclosure 141, lower enclosure 142, connecting section (hinge section in this example) 143, display 144, subdisplay 145, picture light 146, camera 147 and other parts. The mobile phone is manufactured by using the display device according to the embodiment of the present invention as the display 144 and subdisplay 145.

It should be understood by those skilled in the art that various modifications, combinations, sub-combinations and alterations may occur depending on design requirements and other factor in so far as they are within the scope of the appended claims or the equivalents thereof.

What is claimed is:

1. A display device comprising:
    a support substrate;
    a drive circuit provided on the support substrate;
    an interlayer insulating film which covers the drive circuit;
    organic field light-emitting elements arranged in a display region on the interlayer insulating film; and
    a lead-out wiring extended from the organic field light-emitting elements to a peripheral region around the display region, wherein
    the interlayer insulating film includes a laminated film made up of an inorganic insulating film and organic insulating film stacked in this order,
    the organic insulating film has an isolation trench which surrounds the display region, the isolation trench being devoid of the organic insulating film and having the inorganic insulating film at its bottom, and
    the drive circuit and lead-out wiring are insulated from each other by the inorganic insulating film where the lead-out wiring crosses the isolation trench and by the organic insulating film on the sidewalls of the trench.

2. The display device of claim 1, wherein
    a wiring is provided below the isolation trench, the wiring comprising the same layer as for a gate electrode of a bottom gate thin film transistor making up the drive circuit.

3. The display device of claim 2, wherein
    insulating films making up the drive circuit are provided below the inorganic insulating film between the wiring and lead-out wiring.

4. The display device of claim 2, wherein
    at least a semiconductor layer of a thin film transistor making up the pixel circuit or an insulating film, disposed between the semiconductor layer and an electrode connected to the semiconductor layer, is provided below the inorganic insulating film between the wiring and lead-out wiring.

5. The display device of claim 1, wherein
    the drive circuit is formed with a thin film transistor which comprises a semiconductor layer made of amorphous silicon.

* * * * *